(12) United States Patent
Hiroki

(10) Patent No.: US 6,709,521 B1
(45) Date of Patent: Mar. 23, 2004

(54) TRANSFER APPARATUS AND ACCOMMODATING APPARATUS FOR SEMICONDUCTOR PROCESS, AND SEMICONDUCTOR PROCESSING SYSTEM

(75) Inventor: Tsutomu Hiroki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 294 days.

(21) Appl. No.: 09/655,304

(22) Filed: Sep. 5, 2000

(30) Foreign Application Priority Data

Sep. 6, 1999 (JP) .......................................... 11-251445

(51) Int. Cl.[7] ..................... C23C 16/000; B65G 49/07; C23F 1/00; H01L 21/306
(52) U.S. Cl. ..................... 118/719; 414/935; 414/939; 156/345.31; 156/345.32
(58) Field of Search ................ 118/719, 729; 156/345.31, 345.32; 414/935, 939, 936, 941, 222.04, 222.05, 222.06, 609

(56) References Cited

U.S. PATENT DOCUMENTS

| | | | |
|---|---|---|---|
| 4,552,504 A | * 11/1985 | Nakada et al. | ............... 414/735 |
| 4,654,106 A | * 3/1987 | Davis et al. | ........... 156/345.25 |
| 4,908,095 A | * 3/1990 | Kagatsume et al. | ........... 216/67 |
| 5,011,366 A | * 4/1991 | Miller | ........................ 414/811 |
| 5,064,340 A | * 11/1991 | Genov et al. | ............. 414/744.5 |
| 5,135,608 A | * 8/1992 | Okutani | ...................... 438/584 |
| 5,306,380 A | * 4/1994 | Hiroki | ................... 156/345.32 |
| 5,655,060 A | * 8/1997 | Lucas | ........................ 700/250 |
| 5,746,565 A | * 5/1998 | Tepolt | ..................... 414/744.5 |
| 5,823,736 A | * 10/1998 | Matsumura | ................. 414/609 |
| 5,989,346 A | * 11/1999 | Hiroki | ......................... 118/719 |
| 5,993,141 A | 11/1999 | Wytman | |
| 6,051,101 A | * 4/2000 | Ohtani et al. | ........... 156/345.32 |
| 6,155,768 A | * 12/2000 | Bacchi et al. | ........... 414/416.03 |
| 6,164,894 A | * 12/2000 | Cheng | .................... 414/416.03 |
| 6,293,746 B1 | * 9/2001 | Ogawa et al. | ............ 414/744.4 |
| 6,298,684 B1 | * 10/2001 | Mitsuyoshi | .................. 62/337 |
| 6,331,095 B1 | * 12/2001 | Hiroki | .................... 414/222.01 |

FOREIGN PATENT DOCUMENTS

| | | | | |
|---|---|---|---|---|
| JP | 09216182 A | * | 8/1997 | .............. B25J/9/10 |
| JP | 11288995 A | * | 10/1999 | ........... H01L/21/68 |
| WO | WO/0040379 | * | 7/2000 | ............. B25J/18/00 |

* cited by examiner

*Primary Examiner*—Parvis Hassanzadeh
*Assistant Examiner*—Karla Moore
(74) *Attorney, Agent, or Firm*—Oblon, Spivak, McClelland, Maier & Neustadt, P.C.

(57) ABSTRACT

An LCD substrate transfer apparatus includes an articulated arm unit attached to a support base, to be rotatable and stretchable/retractable within a horizontal plane. The articulated arm unit has a distal end arm, which reciprocates in a transfer direction upon stretching/retracting operation of the articulated arm unit. A support member is arranged on the distal end arm to support an LCD substrate. The support member is attached to the distal end arm to be reciprocatable in the transfer direction. A pair of temporary shelves for supporting the LCD substrate are disposed to sandwich the support member when the articulated arm unit and support member retract. The LCD substrate is placed on the temporary shelves, and only the articulated arm unit is rotated to switch the transfer directions.

11 Claims, 12 Drawing Sheets

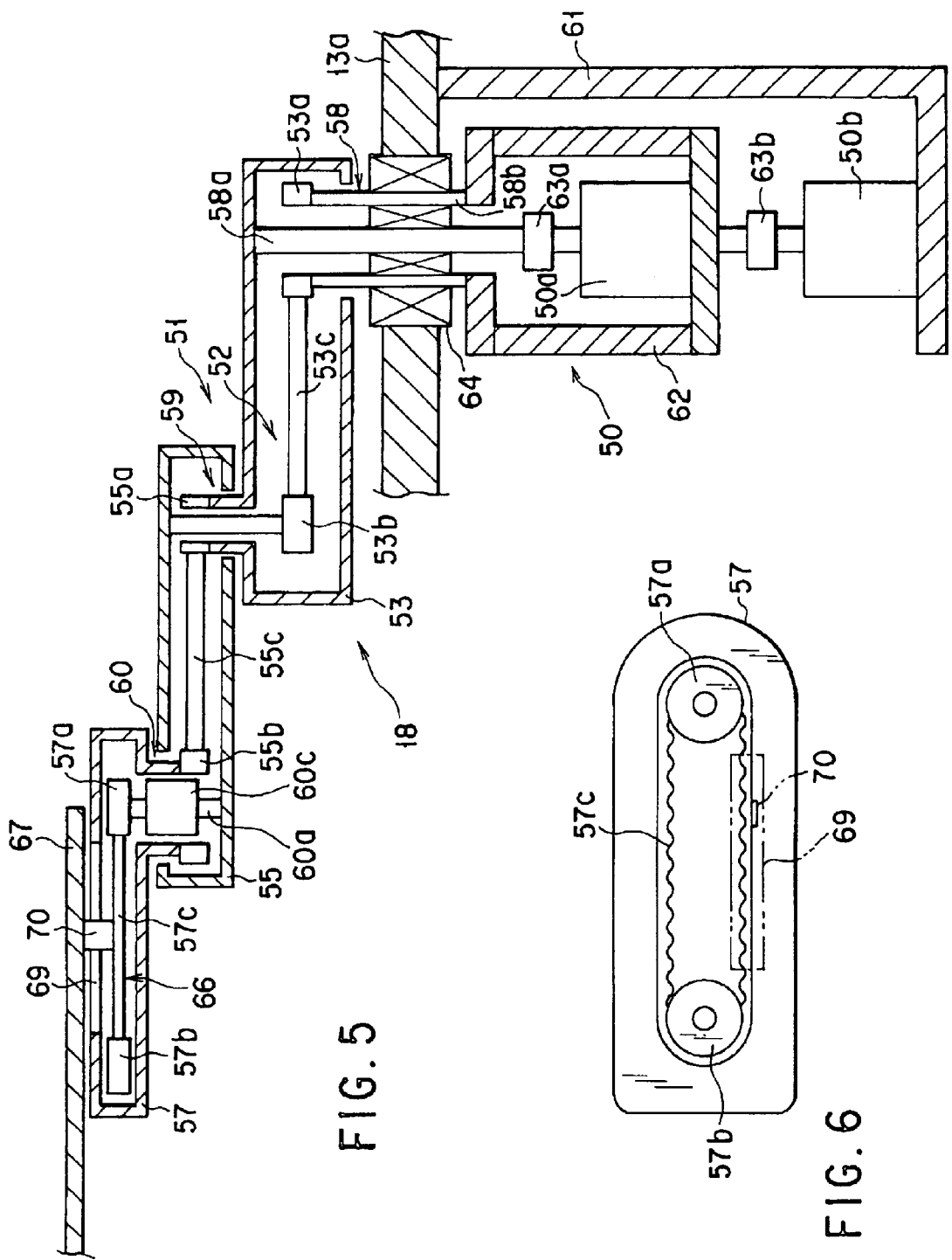

TRANSFER APPARATUS AND ACCOMMODATING APPARATUS FOR SEMICONDUCTOR PROCESS, AND SEMICONDUCTOR PROCESSING SYSTEM

CROSS-REFERENCE TO RELATED APPLICATIONS

This application is based upon and claims the benefit of priority from the prior Japanese Patent Application No. 11-251445, filed Sep. 6, 1999, the entire contents of which are incorporated herein by reference.

BACKGROUND OF THE INVENTION

The present invention relates to a transfer apparatus and an accommodating apparatus for a semiconductor process, and a semiconductor processing system, which handle a target substrate such as a semiconductor or a glass substrate (LCD substrate) for a liquid crystal display (LCD). The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

In processes for manufacturing semiconductor devices, a transfer apparatus is used to transfer a target substrate such as a semiconductor wafer or LCD substrate. For example, the transfer apparatus loads an unprocessed LCD substrate from the atmosphere side in a clean room into a process chamber, and unloads a processed LCD substrate from the process chamber to the atmosphere side in the clean room.

As a transfer apparatus, a scalar twin-pick type, a scalar dual-arm type, and a frog leg type are conventionally known. Any of the transfer apparatuses of these types has an articulated arm unit formed by swingably connecting a plurality of arms to each other. A driving mechanism is disposed at the proximal end of the articulated arm unit, and a support for supporting a target substrate is disposed at the distal end of the articulated arm unit. When the arms swing in the cooperating manner, the joints of the articulated arm unit are stretched and bent, i.e., the articulated arm unit stretches and retracts, to transfer the target substrate on the support.

The target substrate (LCD substrate) to be processed in an LCD manufacturing process is usually set to such a size that a plurality of, e.g., nine, LCD panel products can be obtained from one target substrate. Accordingly, the size of an LCD glass substrate as the target substrate is quite larger than that of a marketed LCD. In recent years, as the size of the LCD itself increases, the size of the LCD glass substrate as the target substrate increases more and more, and some even have a size of, e.g., 960 mm×1,100 mm or 1,100 mm×1,200 mm.

When such a large, rectangular target substrate is to be handled, the following problems occur in the transfer apparatus of the type described above. More specifically, when the articulated arm unit retracts and rotates to switch the transfer directions, the distance from the center of rotation to the distal end of the support for the target substrate or to the corner at the distal end of the target substrate increases, and the radius of swing of the articulated arm unit increases. Therefore, when this transfer apparatus is installed within the vacuum transfer chamber of a semiconductor processing system, a large swing space is required, and accordingly the size of the transfer chamber increases, leading to increases in size and cost of the whole processing system.

On the other hand, when a large target substrate is to be handled, the following problems arise in a semiconductor processing apparatus. More specifically, the worktable in the process chamber is provided with a transfer assist mechanism such as a lifter, in order to assist loading and unloading of a target substrate by a transfer apparatus. As the size of the target substrate increases, the size of the transfer assist mechanism increases. The larger the size of the transfer assist mechanism, the larger obstacle the transfer assist mechanism becomes for the gas flow in the process chamber, thereby decreasing planar uniformity of the process on the target substrate. Besides, where the transfer assist mechanism is incorporated in the worktable, problems arise in that the transfer assist mechanism affects the process on the target substrate, and the structure of the worktable is complicated.

BRIEF SUMMARY OF THE INVENTION

It is an object of the present invention to provide a transfer apparatus for a semiconductor process, which can suppress an increase in swing space necessary for switching the transfer directions even if the size of a target substrate increases.

It is another object of the present invention to provide an accommodating apparatus for a semiconductor process, having a transfer assist mechanism, which can assist transfer of a large-size target substrate and is least likely to disturb the gas flow in the chamber.

It is still another object of the present invention to provide an accommodating apparatus for a semiconductor process, having a transfer assist mechanism, which is least likely to affect a treatment for a target substrate or to bring about a complicated structure of the worktable.

It is still another object of the present invention to provide a semiconductor processing system having the transfer apparatus and the accommodating apparatus described above, and suitable for processing a large-sized target substrate.

According to a first aspect of the present invention, there is provided a transfer apparatus for a semiconductor process, comprising:

an articulated arm unit attached to a support base to be stretchable/retractable within a horizontal plane, the articulated arm unit having a distal end arm which reciprocates in a first direction when the articulated arm unit stretches and retracts;

a support member arranged on the distal end arm to support a target substrate, the support member being attached to the distal end arm to be reciprocatable in the first direction;

a main driving mechanism configured to stretch/retract the articulated arm unit; and a sub-driving mechanism configured to reciprocate the support member relative to the distal end arm.

According to a second aspect of the present invention, there is provided a transfer apparatus for a semiconductor process, comprising:

an articulated arm unit attached to a support base to be stretchable/retractable within a horizontal plane, the articulated arm unit having a distal end arm which reciprocates in a first direction when the articulated arm unit stretches and retracts, the articulated arm unit being rotatable within a horizontal plane relative to the support base;

a support member arranged on the distal end arm to support a target substrate;

a pair of temporary shelves configured to support the target substrate, and disposed to sandwich the support member when the articulated arm unit retracts, a main driving mechanism configured to stretch/retract the articulated arm unit;

a rotational driving mechanism configured to rotate the articulated arm unit; and a vertical driving mechanism configured to vertically drive the support member and the temporary shelves relative to each other in order to transfer the target substrate therebetween.

According to a third aspect of the present invention, there is provided an accommodating apparatus for a semiconductor process, comprising:

an airtight chamber;

a worktable with a mount surface to support a target substrate disposed in the chamber, the target substrate being loaded and unloaded, by a transfer apparatus, onto and from the worktable;

a set of first lifters and a set of second lifters configured to assist loading/unloading of the target substrate onto/from the mount surface, the set of first lifters and the set of second lifters providing support levels at different heights for the target substrate; and a lifter driving mechanism for vertically driving the first and second lifters relative to the worktable, wherein the sets of first and second lifters are disposed to surround the worktable, wherein the first and second lifters respectively have fingers configured to support the target substrate, the fingers capable of being rotated between a projecting position where the fingers project toward the worktable, and a retreated position where the fingers retreat from the worktable, and wherein the worktable has recesses to correspond to the first lifters, and the fingers of the first lifters project into the recesses, when located at the projecting position, to enter under the mount surface.

According to a fourth aspect of the present invention, there is provided a semiconductor processing system comprising:

an airtight process chamber;

a worktable with a mount surface to support a target substrate disposed in the process chamber;

a supply system configured to supply a process gas into the process chamber;

an exhaust system configured to evacuate an interior of the process chamber by vacuum;

an airtight transfer chamber connected to the process chamber through a gate; and a transfer apparatus disposed in the transfer chamber to load/unload the target substrate into/from the process chamber, the transfer apparatus comprising an articulated arm unit attached to a support base to be stretchable/retractable within a horizontal plane, the articulated arm unit having a distal end arm which reciprocates in a first direction when the articulated arm unit stretches and retracts;

a support member arranged on the distal end arm to support the target substrate, the support member being attached to the distal end arm to be reciprocatable in the first direction;

a main driving mechanism configured to stretch/retract the articulated arm unit; and a sub-driving mechanism configured to reciprocate the support member relative to the distal end arm.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a sectional side view showing the transfer apparatus shown in FIG. 4;

FIG. 6 is a schematic plan view showing the interior of the distal end arm of the transfer apparatus shown in FIG. 4;

DETAILED DESCRIPTION OF THE INVENTION

Figure 1:
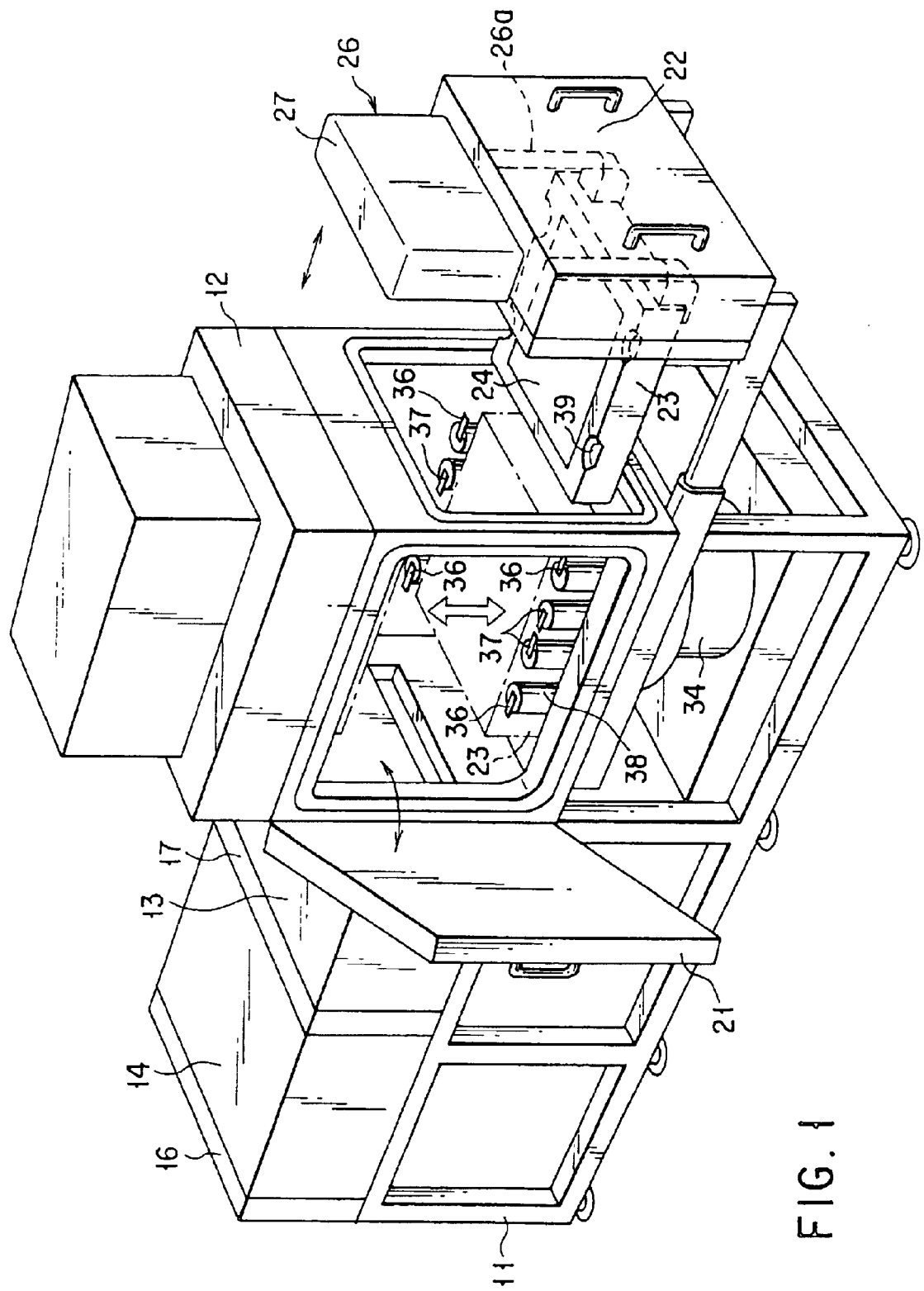
FIG. 1 is a perspective view showing a plasma etching system according to an embodiment of the present invention.

An embodiment of the present invention will be described with reference to the accompanying drawings. In the following description, the constituent elements having substantially the same functions and arrangements are denoted by the same reference numerals, and a repetitive explanation will be made only when it is necessary.

Figure 2:
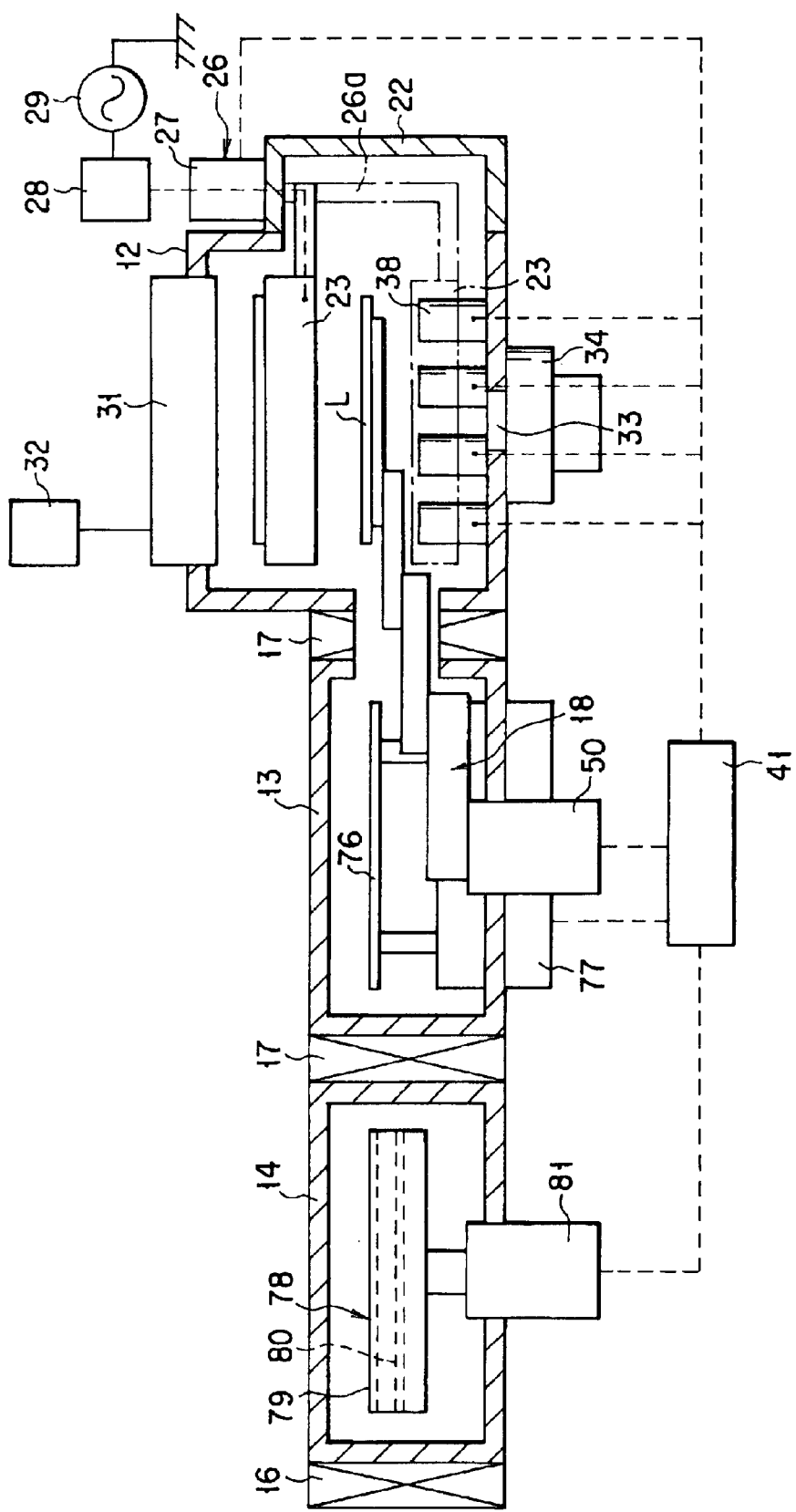
FIG. 2 is a sectional side view showing the system shown in FIG. 1.

FIGS. 1 and 2 are perspective and sectional side views showing a plasma etching system according to an embodiment of the present invention. This system is used in, e.g., the manufacture of an LCD, for patterning a polysilicon film or amorphous silicon film in order to form a TFT (Thin Film Transistor) on an LCD substrate.

As shown in FIGS. 1 and 2, this system has an airtight process chamber 12, airtight transfer chamber 13, and airtight load-lock chamber 14 arranged on a support frame 11. The load-lock chamber 14 is connected to the atmosphere side in a clean room through a gate valve 16, and the chambers 12 to 14 are connected to each other through gate valves 17. A transfer apparatus 18 is disposed in the transfer chamber 13 to load an unprocessed LCD substrate L from the load-lock chamber 14 to the process chamber 12, and to unload a processed LCD substrate L from the process chamber 12 to the load-lock chamber 14.

The process chamber 12 is constituted by a housing, which is made of a conductive material, e.g., aluminum, and capable of being dissembled. Maintenance doors 21 and 22 are disposed on two sides of the process chamber 12. One maintenance door 21 is used for ordinary maintenance, and the other maintenance door 22 is used for maintenance of a lower electrode 24 (to be described later).

A worktable 23 is disposed in the process chamber 12 to horizontally support the LCD substrate L. The worktable 23 is constituted of the lower electrode 24 made of a conductive material, e.g., aluminum, and a ceramic insulating frame 25 supporting the lower electrode 24. The worktable 23 is horizontally supported by a pair of shafts 26a of an elevating mechanism 26. The shafts 26a extend vertically upward along the wall surface of the maintenance door 22, and are connected to a driver 27 disposed on the maintenance door 22.

The worktable 23 is moved by the elevating mechanism 26 between a lower position (indicated by a one-dot chain line in FIG. 2) and an upper position (indicated by a solid line in FIG. 2). When the worktable 23 is placed at the lower position, the transfer apparatus 18 loads and unloads the LCD substrate L onto and from the worktable 23. When the worktable 23 is placed at the upper position, the LCD substrate L is subjected to etching.

A coolant flow path (not shown) is formed in the worktable 23 so as to cool the LCD substrate L during etching. An electrostatic chuck (not shown) is disposed on the upper surface of the worktable 23 to electrostatically chuck the LCD substrate L. Furthermore, the lower electrode 24 is connected to an RF power supply 29 through a matching box 28. During etching, the RF power supply 29 supplies an RF power of, e.g., 13.56 MHz, to the lower electrode 24, to convert a process gas into a plasma. Coolant supply pipes and electric interconnections are arranged to extend through the pair of shafts 26a of the elevating mechanism 26.

A showerhead 31 constituted by a housing made of a conductive material, e.g., aluminum, is disposed on the ceiling of the process chamber 12 to be close to the worktable 23 which is at the upper position. The showerhead 31 is grounded, and functions as an upper electrode. The showerhead 31 is connected to a process gas supply source 32 disposed outside the process chamber 12. The lower surface of the showerhead 31 has a large number of discharge holes (not shown) for discharging the process gas. More specifically, the supply port of a supply system, which is constituted by the gas discharge holes in the lower surface of the showerhead 31, is arranged immediately above the worktable 23, which is at the upper position.

An exhaust port 33 is formed at the center of the bottom of the process chamber 12, and is connected to an exhaust system including a TMP (Turbo-Molecular Pump) 34. This exhaust system can evacuate the interior of the process chamber 12 by vacuum to reduce its pressure to a predetermined vacuum degree. In other words, the exhaust opening of the exhaust system consisting of the exhaust port 33 is arranged immediately under the worktable 23, which is at the lower position.

Figure 3:
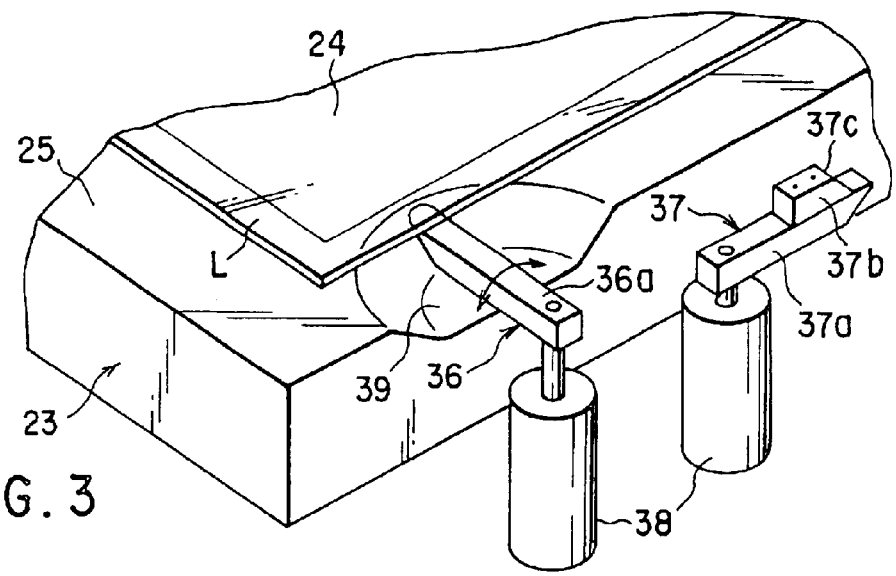
FIG. 3 is an enlarged perspective view showing part of a transfer assist mechanism disposed in the process chamber of the system shown in FIG. 1.

A transfer assist mechanism for assisting loading/unloading of the LCD substrate L is disposed on the bottom of the process chamber 12 to surround the lower electrode 24 which is at the lower position. As shown in FIGS. 10A to 10F, the transfer assist mechanism includes a set of two pairs of first lifters 36, and a set of two pairs of second lifters 37. As shown in FIG. 3, the first and second lifters 36 and 37 respectively have fingers 36a and 37a for supporting the LCD substrate L. The fingers 36a and 37a are driven by a lifter driving mechanism 38 to move vertically relative to the worktable 23 and to rotate within a horizontal plane.

Semicircular recesses 39 are formed in the insulating frame 25 of the worktable 23 to correspond to the fingers 36a of the first lifters 36. Accordingly, as shown in FIG. 3, the fingers 36a of the first lifters 36 can rotate between a projecting position where they project horizontally into the recesses 39 to enter below the mount surface of the worktable 23, and a retreated position where they are retreated from the worktable 23.

No recesses are formed at those positions of the worktable 23, which correspond to the fingers 37a of the second lifters 37. Hence, the fingers 37a of the second lifters 37 can rotate between a projecting position where they project horizontally above the mount surface of the worktable 23, and a retreated position where they are retreated from the worktable 23. A taper block 37b with a taper face 37c for positioning the LCD substrate L is added to the upper surface of each finger 37a of the second lifters 37.

The elevating mechanism 26 for the worktable 23 and the lifter driving mechanism 38 are controlled by a controller 41. More specifically, the elevating operation of the worktable 23 and the vertical and rotating operations of the fingers 36a and 37a of the first and second lifters 36 and 37 are performed in relation to each other under the control of the controller 41.

The transfer assist mechanism including the first and second lifters 36 and 37 is arranged away from the exhaust port 33 to be rather close to the sidewall of the process chamber 12. This arrangement is selected such that, during etching, the transfer assist mechanism does not disturb the process gas flowing around the worktable 23, which is at the upper position, toward the exhaust port 33. As a result, the transfer assist mechanism can be prevented from disturbing the process gas flow and decreasing planar uniformity of the process on the LCD substrate L. Furthermore, since the transfer assist mechanism is not incorporated in the worktable 23, it is least likely to affect the process on the LCD substrate L or to bring about a complicated structure of the worktable 23. Note that this transfer assist mechanism is not limited to a mechanism for a process chamber, but may be applied to a mechanism for a worktable disposed in a vacuum preparation chamber or the like.

Figure 4:
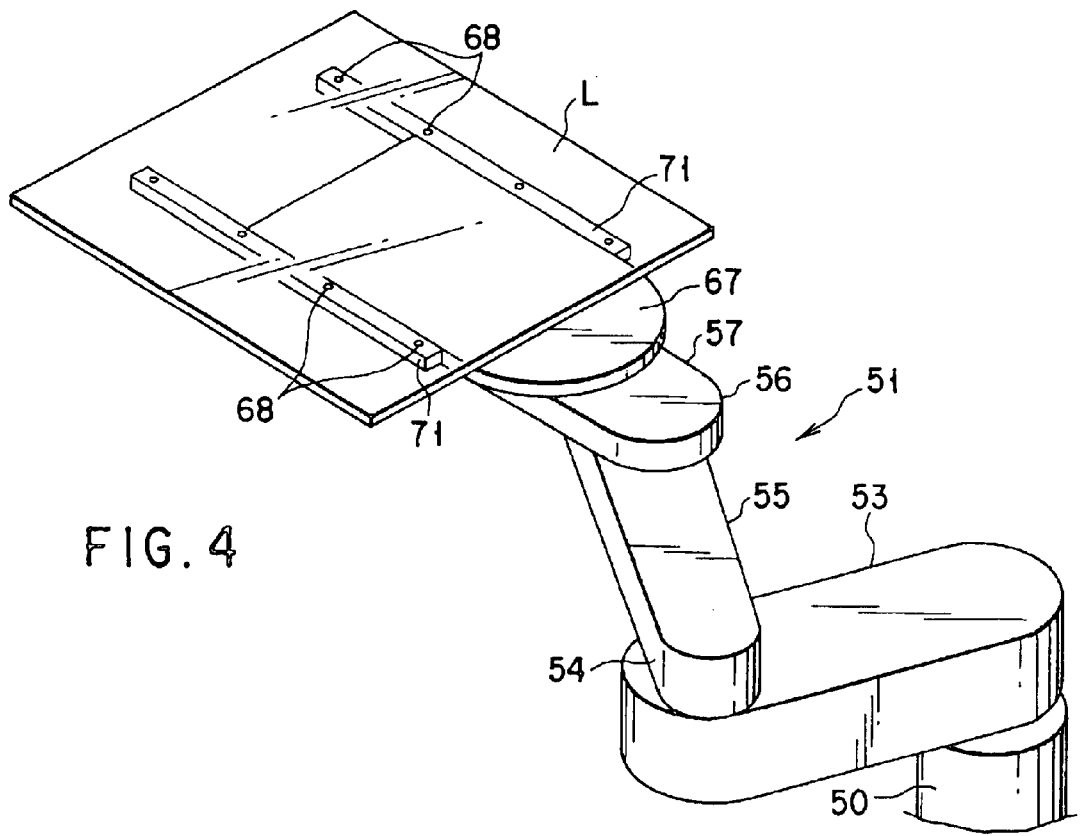
FIG. 4 is a perspective view showing a transfer apparatus disposed in the transfer chamber of the system shown in FIG. 1.

FIGS. 4 and 5 are perspective and sectional side views showing the transfer apparatus 18 disposed in the transfer chamber 13. As shown in FIGS. 4 and 5, an articulated arm unit 51 of the transfer apparatus 18 is attached to a floor 13a of the transfer chamber 13, i.e., the support base of the transfer apparatus 18, such that it can rotate and stretch/retract within a horizontal plane. The articulated arm unit 51 is connected to a driver 50 disposed under the floor 13a to drive it. The articulated arm unit 51 consists of first to third arms 53, 55, and 57, which are swingably connected to each other through first and second joints 54 and 56. The third arm 57 is referred to as a distal end arm, hereinafter, if necessary.

The outer housing of each of the first to third arms 53, 55, and 57 is constituted by an elongated hollow casing. A main transmission 52, which is part of a main driving mechanism for rotating and stretching/retracting the articulated arm unit 51, is arranged on the first to third arms 53, 55, and 57. As shown in FIG. 5, the main transmission 52 has gear pulleys 53a and 53b, and 55a and 55b disposed at the proximal and distal ends in the casings of the first and second arms 53 and 55, timing belts 53c and 55c extending between the gear pulleys 53a and 53b, and 55a and 55b, respectively, and coaxial shafts 58, 59, and 60 extending in the vertical direction to respectively connect the driver 50 and the first to third arms 53, 55, and 57 to each other.

A core shaft 58a of the coaxial shaft 58 transmits a rotational driving force of a first motor 50a of the driver 50 to the casing of the first arm 53. An outer shaft 58b of the coaxial shaft 58 transmits a rotational driving force of a second motor 50b of the driver 50 to the gear pulley 53a. The first motor 50a is used to stretch and retract the articulated arm unit 51, and the second motor 50b is used to rotate the articulated arm unit 51.

The second motor 50b is attached to a frame 61 fixed to the bottom of the floor 13a. The first motor 50a is attached to a frame 62 to be rotated by the second motor 50b together with the outer shaft 58b of the coaxial shaft 58. In FIG. 5, reference numerals 63a and 63b denote couplings; and 64, a magnetic fluid seal.

The main transmission 52 is set such that, when the articulated arm unit 51 stretches and retracts, the third arm, i.e., the distal end arm 57, linearly reciprocates in directions to transfer the LCD substrate L. More specifically, the distance between the gear pulleys 53a and 53b and that between the gear pulleys 55a and 55b are set equal. The ratio in diameter (i.e., the gear ratio) of the gear pulley 53a to the gear pulley 53b is 2:1, and that of the gear pulley 55a to the gear pulley 55b is set to 1:2.

A support member 67 for supporting the LCD substrate L is attached to the third arm, i.e., the distal end arm 57, to be reciprocatable in the same directions as the reciprocating directions of the distal end arm 57. A pair of sticks 71, extending in the reciprocating directions of the support member 67, are disposed on the two sides of the support member 67. A plurality of projections 68 made of Teflon (Tradename) or the like are formed on the sticks 71 to horizontally support the LCD substrate L on them.

A sub-transmission 66, which is part of a sub-driving mechanism for reciprocating the support member 67 relative to the arm 57, is also disposed on the distal end arm 57. As shown in FIGS. 5 and 6, the sub-transmission 66 has gear pulleys 57a and 57b disposed at the proximal and distal ends in the casing of the third arm 57, and a timing belt 57c extending between the gear pulleys 57a and 57b. The gear pulley 57a is connected to the casing of the second arm 55 through a core shaft 60a of the coaxial shaft 60. A speed-increasing device 60c is arranged on the core shaft 60a to increase the rotational speed of the casing of the arm 55 five times and transmit the increased rotational speed to the gear pulley 57a. If the support member 67 can have a sufficiently long stroke, the speed-increasing device 60c can be omitted.

An elongated hole 69 is formed in the ceiling (opening/closing cover) of the casing of the arm 57 along one side of the timing belt 57c. A connector 70 is fixed to this one side of the timing belt 57c to project upward through the elongated hole 69. The connector 70 connects the timing belt 57c and support member 67 to each other. Hence, when the articulated arm unit 51 stretches and retracts by the first motor 50a, the timing belt 57c runs, and accordingly reciprocates the support member 67.

In short, in the transfer apparatus 18 with the above arrangement, the whole articulated arm unit 51 is rotated by the second motor 50b through 180° so as to be directed toward either the process chamber 12 or load-lock chamber 14, thereby switching the transfer directions. The first motor 50a drives the articulated arm unit 51 so that the arm unit 51 stretches and retracts. Upon the stretching and retracting operations of the articulated arm unit 51, the support member 67 is reciprocated to transfer the LCD substrate L. When the articulated arm unit 51 is retracted the most, the support member 67 is retracted the most (is retreated). At this time, the distance from the center of rotation of the articulated arm unit 51 (the center of the coaxial shaft 58) to the distal end of the support member 67 (the distal end of the stick 71) is set to be equal to or less than the distance (radius of swing motion) from the center of rotation of the articulated arm unit 51 to the distal end of the first or second arm 53 or 55.

As shown in FIGS. 2, and 8A to 8D, a pair of temporary shelves 76 are disposed in the transfer chamber 13 to support the LCD substrate L, such that when the articulated arm unit 51 and support member 67 retract, the temporary shelves 76 sandwich the support member 67. The temporary shelves 76 are driven by a vertical driving mechanism 77, disposed under the floor 13a of the transfer chamber 13, vertically relative to the transfer apparatus 18. When the temporary shelves 76 move vertically, the LCD substrate L is transferred between the support member 67 of the transfer apparatus 18 and the temporary shelves 76.

A buffer 78 with two support levels 79 and 80 for supporting the LCD substrate L is disposed in the load-lock chamber 14. The buffer 78 is driven by a vertical driving mechanism 81, disposed under the floor of the load-lock chamber 14, vertically relative to the transfer apparatus 18. When the buffer 78 moves vertically, the LCD substrate L is transferred between the support member 67 of the transfer apparatus 18 and the support levels 79 and 80 of the buffer 78.

The driver 50 of the articulated arm unit 51, the vertical driving mechanism 77 of the temporary shelves 76, and the vertical driving mechanism 81 of the buffer 78 are controlled by the controller 41. In other words, the stretching/retracting and rotating movements of the articulated arm unit 51 and the vertical movement of the temporary shelves 76 or buffer 78 are performed in relation to each other under the control of the controller 41.

Figure 7A:
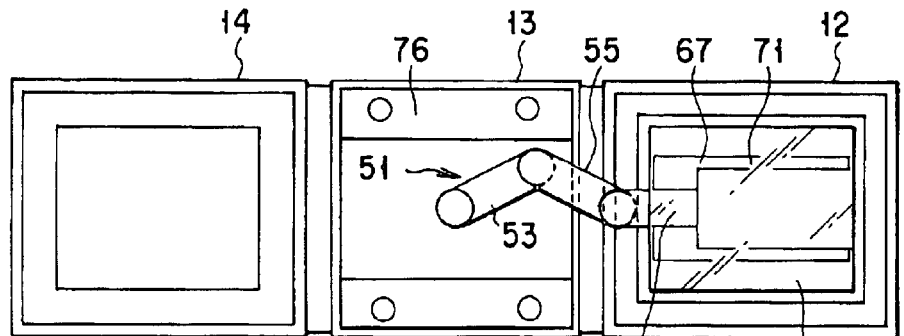
FIGS. 7A, 7B, 7C, and 7D are plan views showing the basic operations of the transfer apparatus and temporary shelves of the system shown in FIG. 1 by way of operation of fetching an LCD substrate from the process chamber.
Figure 7B:
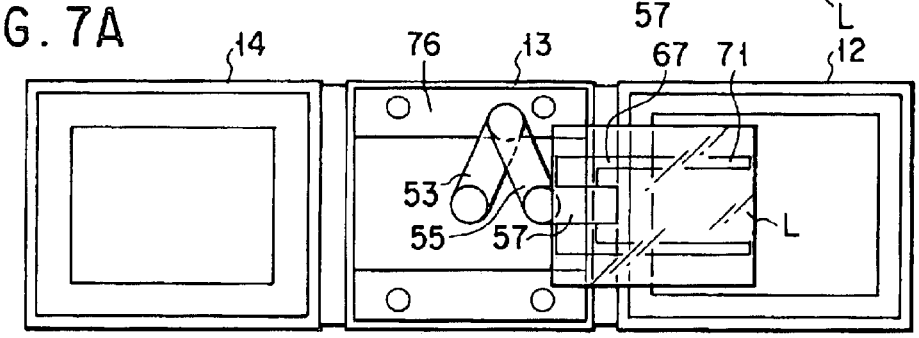

FIGS. 7A to 7D are plan views showing the basic operations of the transfer apparatus 18 and temporary shelves 76 by way of operation of fetching the LCD substrate L from the process chamber 12. As shown in FIG. 7A, when the articulated arm unit 51 stretches almost completely and the support member 67 extends from the distal end arm 57, the LCD substrate L in the process chamber 12 is transferred onto the support member 67. As shown in FIG. 7B, as the articulated arm unit 51 retracts by the first motor 50a, the support member 67 also retracts toward the distal end arm 57.

Figure 7C:
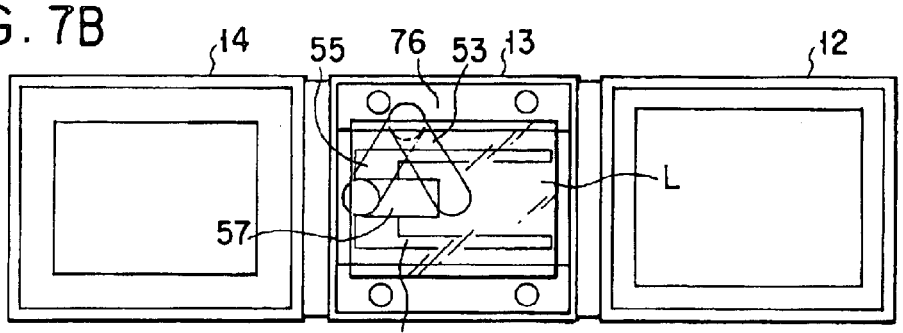
Figure 7D:
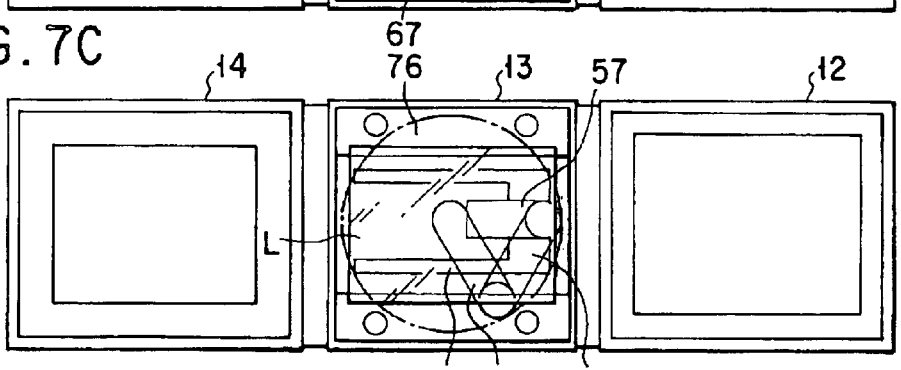

As shown in FIG. 7C, when the articulated arm unit 51 retracts the most, the support member 67 retracts the most (is retreated), and the LCD substrate L is transferred to the transfer chamber 13. In this state, the temporary shelves 76 located below the support member 67 move upward, and the LCD substrate L is transferred from the support member 67 to the temporary shelves 76. AS shown in FIG. 7D, while the LCD substrate L being left on the temporary shelves 76, the articulated arm unit 51 rotates through 180° to direct itself toward the load-lock chamber 14. Then, the temporary shelves 76 supporting the LCD substrate L move downward, and the LCD substrate L is transferred from the temporary shelves 76 to the support member 67.

In this manner, when the articulated arm unit 51 switches its transfer directions in the transfer chamber 13, the LCD substrate L is not rotated. Even if the distance from the center of rotation of the articulated arm unit 51 (the center of the coaxial shaft 58) to the corner at the distal end of the LCD substrate L is large, it does not adversely influence the swing space of the articulated arm unit 51. In addition, when the articulated arm unit 51 retracts, the support member 67 also retracts (retreats) to locate within the swing radius of the articulated arm unit 51 determined by the first and second arms 53 and 55. Thus, this swing radius does not expand. The circle indicated by the one-dot chain line in FIG. 7D is the trace of the swing radius of the articulated arm unit 51.

Figure 8A:
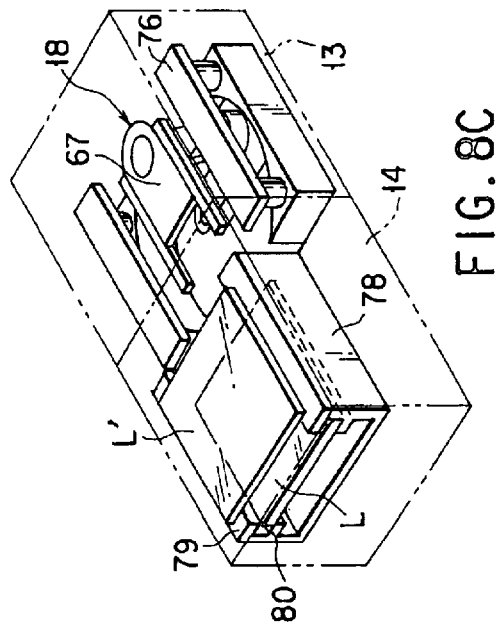
FIGS. 8A, 8B, 8C, and 8D are perspective views showing the relationship in operation between the transfer apparatus and the buffer of the load-lock chamber of the system shown in FIG. 1.

FIGS. 8A to 8D, and 9A to 9D are perspective views showing the relationship in operation between the transfer apparatus 18 and the buffer 78 of the load-lock chamber 14. As a premise of the explanation, a processed LCD substrate L is supported on the support member 67 of the articulated arm unit 51 of the transfer chamber 13, as shown in FIG. 8A. An unprocessed LCD substrate L' is supported on the upper support level 79 of the buffer 78 in the load-lock chamber 14. From this state, the processed LCD substrate L is transferred to the load-lock chamber 14 and the unprocessed LCD substrate L' is transferred to the load-lock chamber 13 with the following procedures.

Figure 8B:
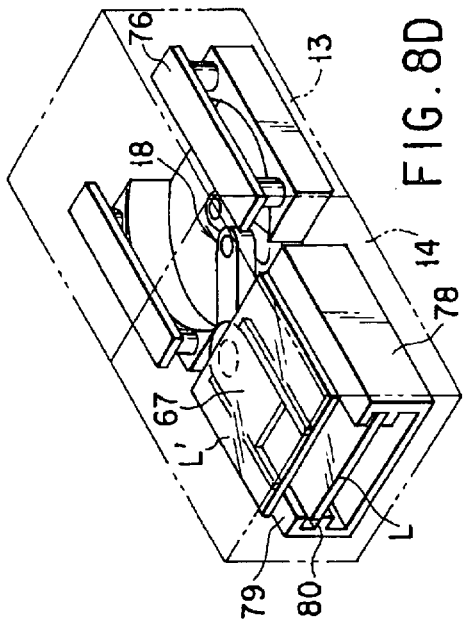
Figure 8C:
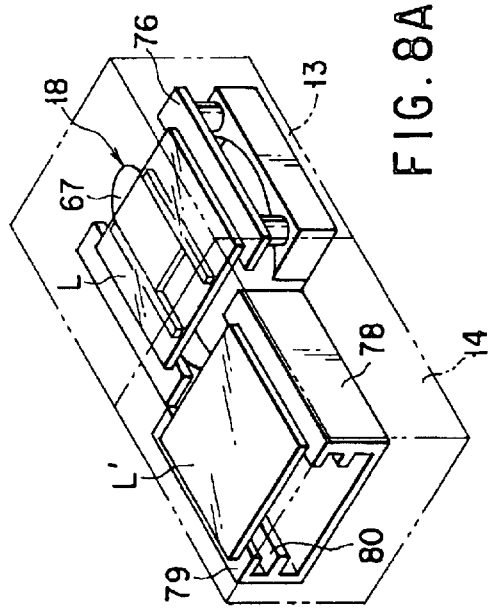

As shown in FIG. 8B, the articulated arm unit 51 and support member 67 stretch, and the processed LCD substrate L on the support member 67 is transferred to the load-lock chamber 14 and inserted between the upper and lower support levels 79 and 80 of the buffer 78. The buffer 78 moves upward, and the processed LCD substrate L is transferred from the support member 67 to the lower support level 80. As shown in FIG. 8C, the articulated arm unit 51 and support member 67 retract to return to the transfer chamber 13.

Figure 8D:
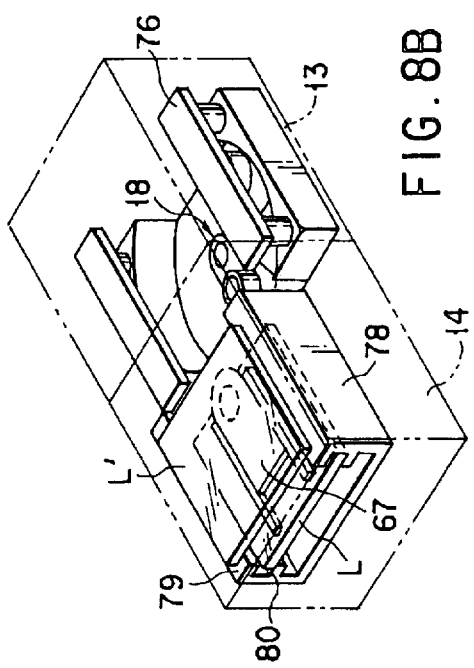

The buffer 78 moves downward until the support member 67 reaches the height of the upper support level 79 of the buffer 78. Subsequently, the articulated arm unit 51 and support member 67 stretch, and the support member 67 enters under the unprocessed LCD substrate L' supported by the upper support level 79. As shown in FIG. 8D, the buffer 78 moves further downward, and the unprocessed LCD substrate L' is transferred from the upper support level 79 to the support member 67.

Figure 9A:
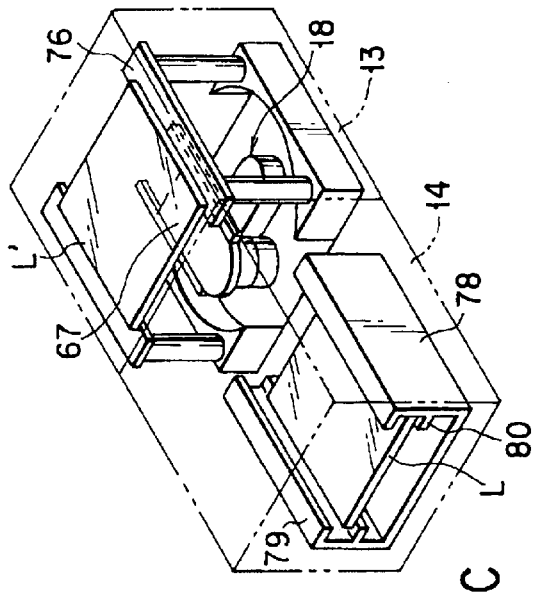
FIGS. 9A, 9B, 9C, and 9D are perspective views, continuous to FIGS. 8A to 8D, showing the relationship in operation between the transfer apparatus and the buffer of the load-lock chamber.
Figure 9B:
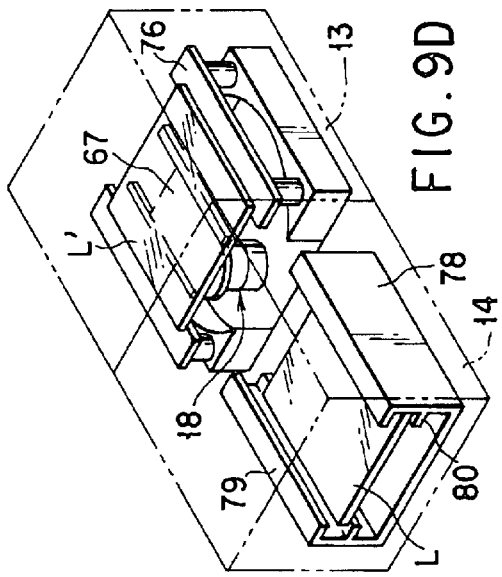

As shown in FIG. 9A, the articulated arm unit 51 and support member 67 retract, and the unprocessed LCD substrate L' on the support member 67 is transferred to the transfer chamber 13. As shown in FIG. 9B, the temporary shelves 76 move upward, and the unprocessed LCD substrate L' is transferred from the support member 67 to the temporary shelves 76. The temporary shelves 76 hold the unprocessed LCD substrate L' above the support member 67.

Figure 9C:
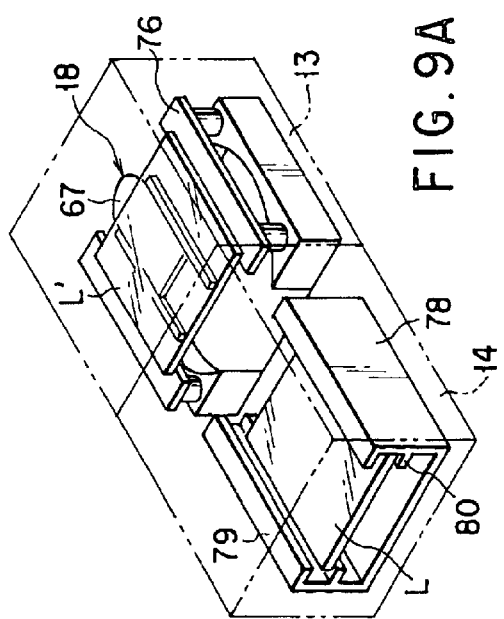
Figure 9D:
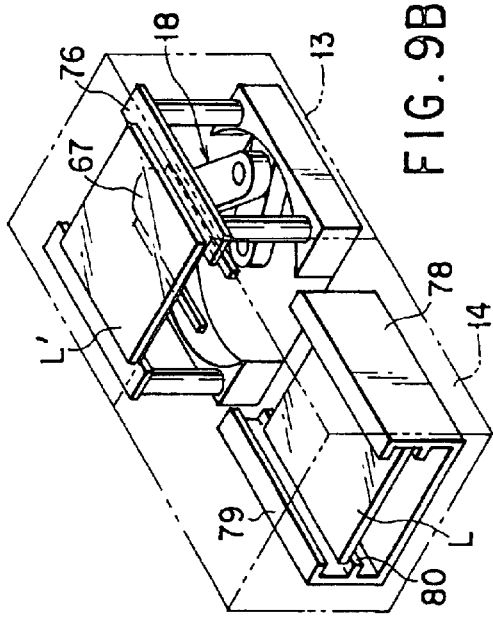

As shown in FIG. 9C, while the LCD substrate L' being left on the temporary shelves 76, the articulated arm unit 51 rotates through 180°, to direct itself toward the process chamber 12. As shown in FIG. 9D, the temporary shelves 76 supporting the LCD substrate L' move downward, and the LCD substrate L' is transferred from the temporary shelves 76 to the support member 67. Then, the unprocessed LCD substrate L' is transferred to the process chamber 12 with the following procedures.

FIGS. 10A to 10F are perspective views showing the relationship in operation between the transfer apparatus 18 and the worktable 23 of the process chamber 12. As described above, the worktable 23 of the process chamber 12 can be moved by the elevating mechanism 26 between the lower position (indicated by the one-dot chain line in FIG. 2) and the upper position (indicated by the solid line in FIG. 2). When the worktable 23 is at the lower position, the transfer apparatus 18 loads and unloads the LCD substrate L on and from the worktable 23.

Figure 10A:
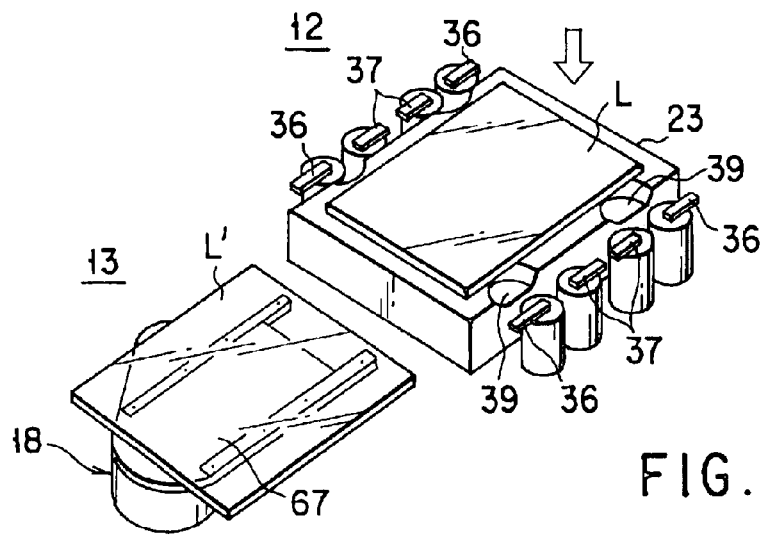
FIGS. 10A, 10B, 10C, 10D, 10E, and 10F are perspective views showing the relationship in operation between the transfer apparatus and the worktable of the process chamber of the system shown in FIG. 1.

As a premise of the explanation, the worktable 23 is located at the lower position, and a processed LCD substrate L is placed on it, as shown in FIG. 10A. An unprocessed LCD substrate L' is supported on the support member 67 of the articulated arm unit 51 in the transfer chamber 13. From this state, the processed LCD substrate L is transferred to the transfer chamber 13 and the unprocessed LCD substrate L' is transferred to the process chamber 12 with the following procedures.

Figure 10B:
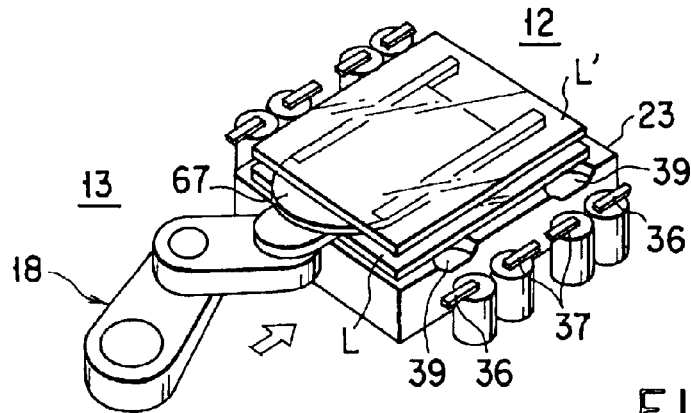
Figure 10C:
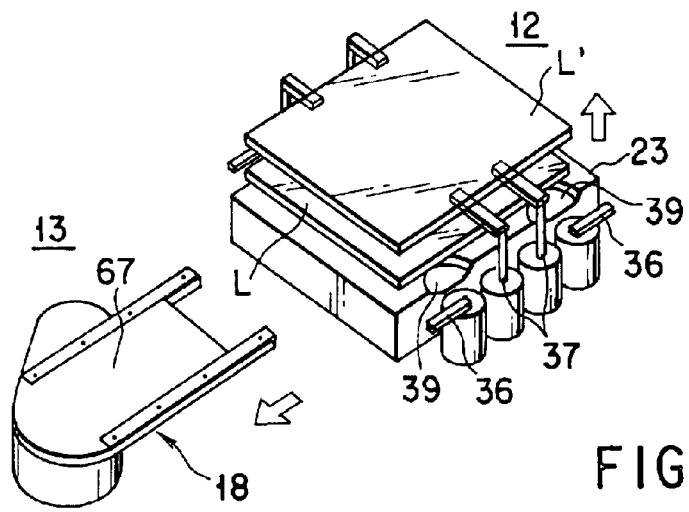

As shown in FIG. 10B, the articulated arm unit 51 and support member 67 stretch, and the unprocessed LCD substrate L' on the support member 67 is transferred to the process chamber 12 and placed above the processed LCD substrate L. As shown in FIG. 10C, the fingers 37a of the second lifters 37 move upward and swing to project horizontally above the worktable 23, and in further move upward to receive the unprocessed LCD substrate L' from the support member 67. The second lifters 37 hold the unprocessed LCD substrate L' at the upper level. The articulated arm unit 51 and support member 67 retract to return to the transfer chamber 13.

Figure 10D:
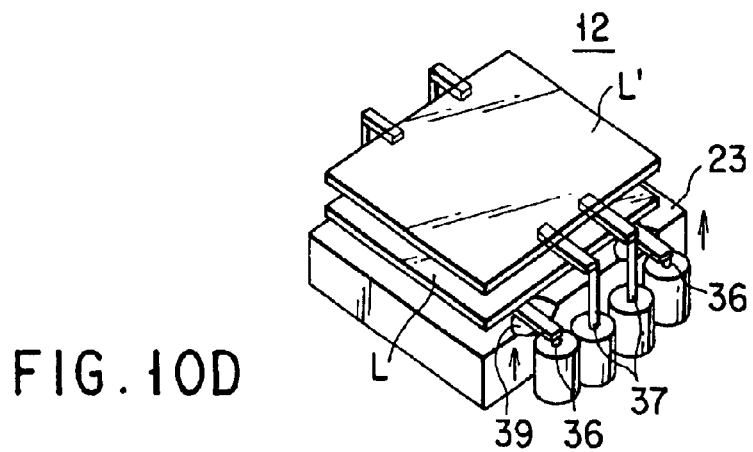
Figure 10E:
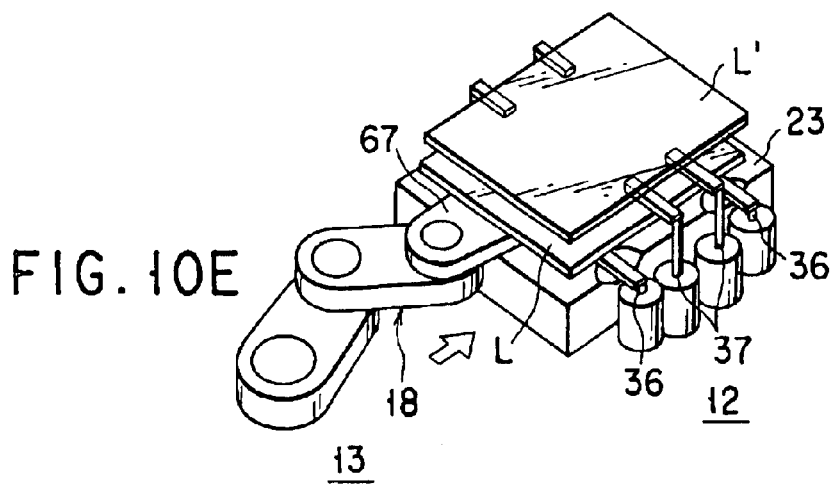

As shown in FIG. 10D, the fingers 36a of the first lifters 36 swing to horizontally project into the recesses 39 and move upward, to receive the processed LCD substrate L from the worktable 23. The first lifters 36 hold the processed LCD substrate L at an intermediate level between the mount surface of the worktable 23 and the upper level. As shown in FIG. 10E, the articulated arm unit 51 and support member 67 stretch, and the support member 67 enters under the processed LCD substrate L. In this state, the first lifters 36 move downward, and the processed LCD substrate L is transferred from the first lifters 36 to the support member 67.

Figure 10F:
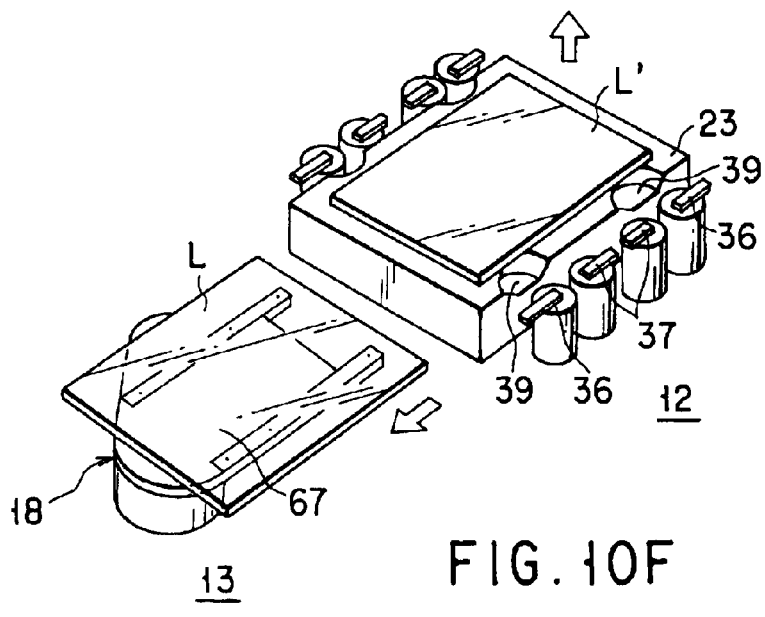

As shown in FIG. 10F, the articulated arm unit 51 and support member 67 retract, and the processed LCD substrate L is transferred to the transfer chamber 13. Then, the second lifters 37 move downward, and the unprocessed LCD substrate L' is transferred to the first lifters 36. The fingers 37a of the second lifters 37 rotate to retreat from the worktable 23. The first lifters 36 then move downward, and the unprocessed LCD substrate L' is transferred to the worktable 23.

The fingers 36a of the first lifters 36 rotate to retreat from the worktable 23. Then, the worktable 23 is moved upward from the lower position (indicated by the one-dot chain line in FIG. 2) to the upper position (indicated by the solid line in FIG. 2). At this position, the LCD substrate L is subjected to etching.

The transfer assist mechanism including the first and second first lifters 36 and 37, and the like is arranged near the sidewall of the bottom of the process chamber 12 away from the upper position (process position) of the worktable 23. This arrangement is selected such that during etching, the transfer assist mechanism does not disturb the process gas flow from around the worktable 23, which is at the upper position, to the exhaust port 33. In other words, during etching, the transfer assist mechanism does not become an obstacle for the process gas flow extending from the showerhead 31 to the exhaust port 33. Therefore, during etching, the process gas flow is least likely to be disturbed and to decrease planar uniformity of the process on the LCD substrate.

In the above embodiment, the sub-transmission 66 of the sub-driving mechanism for reciprocating the support member 67 relative to the arm 57 has the gear pulleys 57a and 57b, and timing belt 57c, and is mechanically connected to the main transmission 52 of the main driving mechanism. Other than this arrangement, as a mechanism for reciprocating the support member 67 relative to the distal end arm 57, the following arrangements can be used.

Figure 11A:
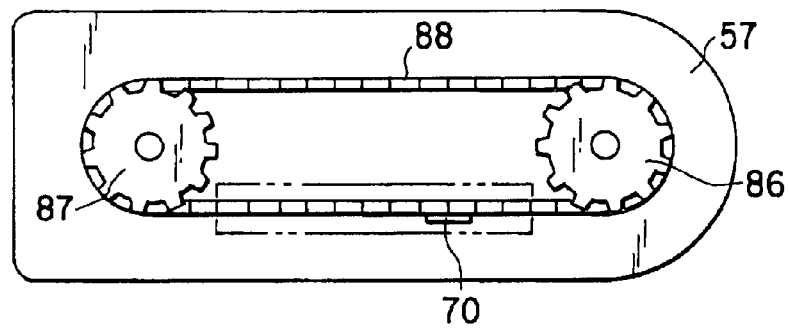
FIGS. 11A and 11B are schematic plan and sectional side views showing a modification of the mechanism in the transfer apparatus shown in FIG. 4, which reciprocates the support member relative to the distal end arm.
Figure 11B:
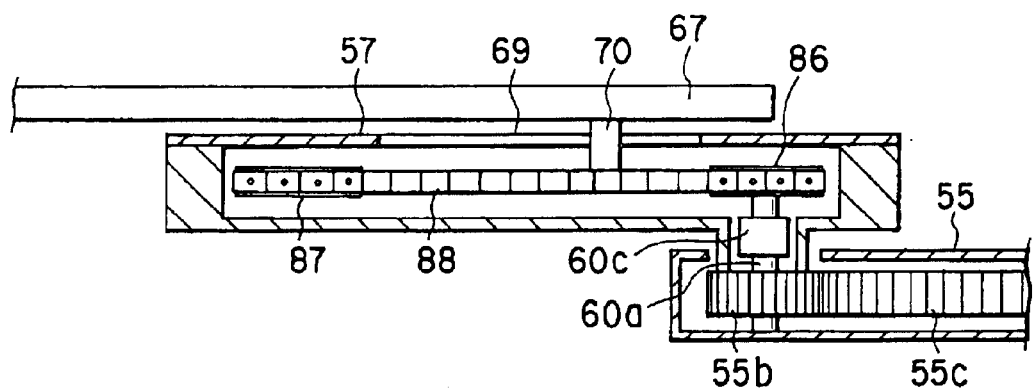

FIGS. 11A and 11B are schematic plan and sectional side views showing a modification of the mechanism that reciprocates the support member 67 relative to the distal end arm 57. In this modification, a driving sprocket 86 and driven sprocket 87 are disposed at the proximal and distal ends, respectively, in the casing of the third arm 57, and an endless chain 88 extends between the sprockets 86 and 87. The endless chain 88 is connected to the support member 67 through a connector 70. Therefore, when the articulated arm unit 51 stretches and retracts by the first motor 50a, the endless chain 88 travels, and accordingly the support member 67 is reciprocated.

Figure 12A:
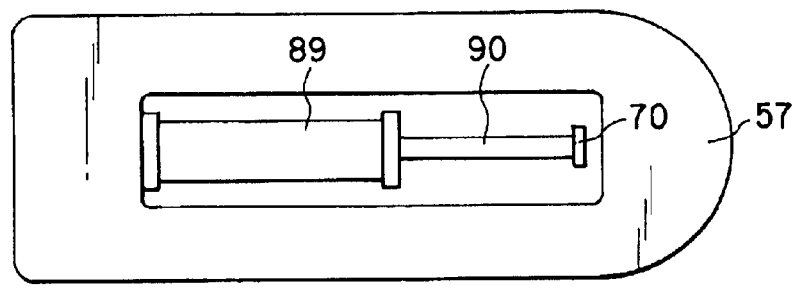
FIGS. 12A and 12B are schematic plan and sectional side views showing another modification of the mechanism in the transfer apparatus shown in FIG. 4, which reciprocates the support member relative to the distal end arm.
Figure 12B:
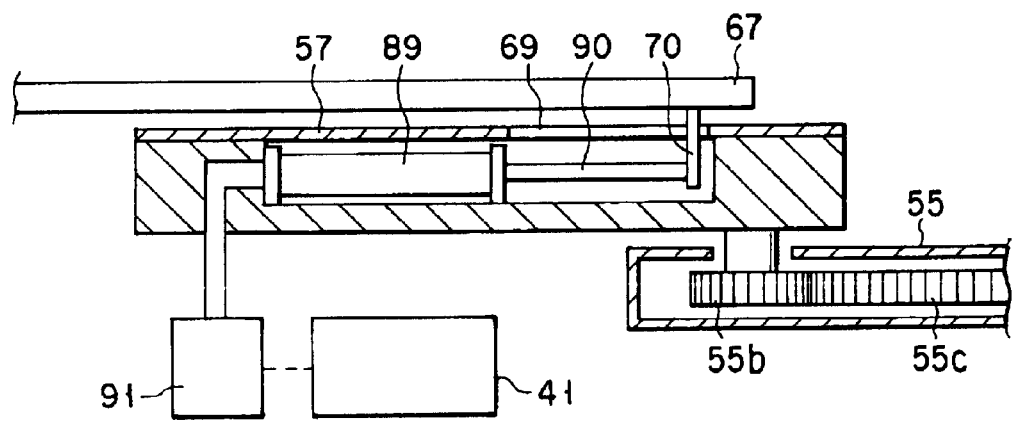

FIGS. 12A and 12B are schematic plan and sectional side views showing another modification of the mechanism that moves the support member 67 relative to the distal end arm 57. In this modification, a piston air cylinder 89 is disposed in the casing of the third arm 57, and the support member 67 is connected to a piston rod 90 of the piston air cylinder 89. A driver 91 of the piston air cylinder 89 is controlled by the controller 41, independently of stretching/retracting of the articulated arm unit 51.

In other words, in this modification, the sub-driving mechanism for the support member 67 is controlled by the controller 41, independently of the main driving mechanism for the articulated arm unit 51. Accordingly, the driver 91 of the piston air cylinder 89 may be controlled such that, for example, in FIG. 7A, the support member 67 does not stretch from the distal end arm 57 while the articulated arm unit 51 is stretching, but start stretching from the distal end arm 57 after the articulated arm unit 51 has stretched out. Instead, the driver 91 of the piston air cylinder 89 may be controlled such that the support member 67 stretches from the distal end arm 57 before the articulated arm unit 51 starts stretching. Still, instead, the driver 91 of the piston air cylinder 89 may be independently controlled such that, as in the case shown in FIG. 7A, reciprocation of the support member 67 relative to the distal end arm 57 is performed in accordance with stretching/retracting of the articulated arm unit 51.

Figure 13A:
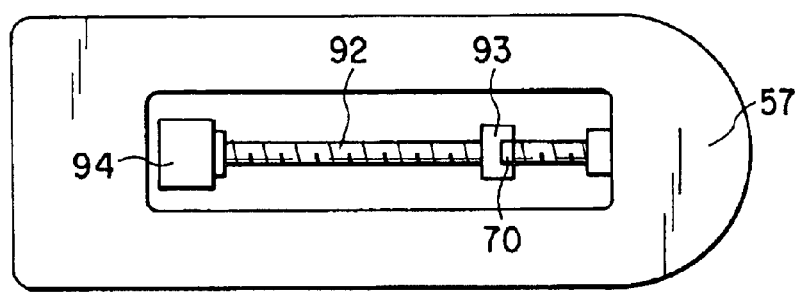
FIGS. 13A and 13B are schematic plan and sectional side views showing still another modification of the mechanism in the transfer apparatus shown in FIG. 4, which reciprocates the support member relative to the distal end arm.
Figure 13B:
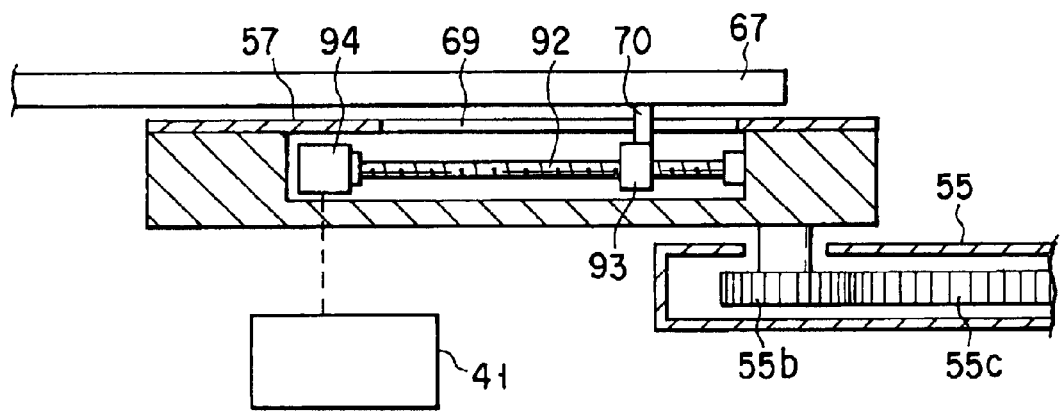

FIGS. 13A and 13B are schematic plan and longitudinally sectional side views showing still another modification of the mechanism that reciprocates the support member 67 relative to the distal end arm 57. In this modification, a ball screw 92 and a motor 94 for applying a rotational driving force to the ball screw 92 are disposed in the casing of the third arm 57. The ball screw 92 engages with a nut 93 linearly moved by rotation of the ball screw 92, and the nut 93 is connected to the support member 67. The motor 94 is controlled by the controller 41, independently of stretching/retracting of the articulated arm unit 51.

In other words, also in this modification, the sub-driving mechanism for the support member 67 is controlled by the controller 41, independently of the main driving mechanism for the articulated arm unit 51, as in the modification shown in FIGS. 12A and 12B. Accordingly, stretching/retracting of the articulated arm unit 51 and reciprocation of the support member 67 can be combined in an arbitrary manner, as in the modification shown in FIGS. 12A and 12B.

In the above embodiment, the vertical driving mechanism 77 and vertical driving mechanism 81 are provided to the temporary shelves 76 and buffer 78, respectively, to move them vertically relative to the transfer apparatus 18. Alternatively, a vertical driving mechanism may be provided to the transfer apparatus 18 to vertically move it. In this case, the vertical driving mechanisms 77 and 81 of the temporary shelves 76 and buffer 78 become unnecessary.

The articulated arm unit of the transfer apparatus to which the present invention can be applied is not limited to the arrangement of the embodiment described above, but may any one of transfer arm units of a scalar twin-pick type, scalar dual-arm type, and frog leg type. In other words, the present invention can be applied to any transfer apparatus as far as its articulated arm unit can stretch and retract within a horizontal plane and the distal end arm of the articulated arm unit reciprocates in the transfer direction when the articulated arm unit stretches and retracts.

In the above embodiment, a plasma etching apparatus has been described as an example of a semiconductor processing apparatus. The present invention can also be applied to other processing apparatuses such as a film formation apparatus and an ashing apparatus. Besides, the present invention can be applied to an apparatus for processing a semiconductor wafer, not an LCD substrate, as a target substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A transfer apparatus for a semiconductor process, comprising:
    an articulated arm unit attached to a support base to be stretchable/retractable within a horizontal plane, the articulated arm unit having a distal end arm which reciprocates in a first direction when the articulated arm unit stretches and retracts, the articulated arm unit being rotatable within a horizontal plane relative to the support base;
    a support member arranged on the distal end arm to support a target substrate;
    a pair of temporary shelves configured to support the target substrate, and disposed to sandwich the support member when the articulated arm unit retracts, the temporary shelves being arranged not to rotate together with the articulated arm unit;

a main driving mechanism configured to stretch/retract the articulated arm unit;

a rotational driving mechanism configured to rotate the articulated arm unit; and a vertical driving mechanism configured to vertically drive the support member and the temporary shelves relative to each other in order to transfer the target substrate therebetween.

2. A transfer apparatus for a semiconductor process, comprising:

an articulated arm unit attached to a support base to be stretchable/retractable within a horizontal plane, the articulated arm unit having a distal end arm which reciprocates in a first direction when the articulated arm unit stretches and retracts;

a support member arranged on the distal end arm to support a target substrate, the support member being attached to the distal end arm to be reciprocatable in the first direction;

a main driving mechanism configured to stretch/retract the articulated arm unit;

a sub-driving mechanism configured to reciprocate the support member relative to the distal end arm;

said support member configured to reciprocate relative to the distal end arm while the articulated arm unit stretches and retracts;

said sub-driving mechanism mechanically connected to the main driving mechanism such that reciprocation of the support member is performed in accordance with stretching/retracting of the articulated arm unit; and said sub-driving mechanism including,
a pair of sprockets axially supported by the distal end arm, and
a chain extending between the pair of sprockets, the chain being connected to the support member.

3. A transfer apparatus for a semiconductor process, comprising:

an articulated arm unit attached to a support base to be stretchable/retractable within a horizontal plane, the articulated arm unit having a distal end arm which reciprocates in a first direction when the articulated arm unit stretches and retracts;

a support member arranged on the distal end arm to support a target substrate, the support member being attached to the distal end arm to be reciprocatable in the first direction;

a main driving mechanism configured to stretch/retract the articulated arm unit;

a sub-driving mechanism configured to reciprocate the support member relative to the distal end arm;

said support member configured to reciprocate relative to the distal end arm while the articulated arm unit stretches and retracts;

said sub-driving mechanism mechanically connected to the main driving mechanism such that reciprocation of the support member is performed in accordance with stretching/retracting of the articulated arm unit; and said sub-driving mechanism connected to the main driving mechanism through a speed-increasing device.

4. A transfer apparatus for a semiconductor process, comprising:

an articulated arm unit attached to a support base to be stretchable/retractable within a horizontal plane, the articulated arm unit having a distal end arm which reciprocates in a first direction when the articulated arm unit stretches and retracts;

a support member arranged on the distal end arm to support a target substrate, the support member being attached to the distal end arm to be reciprocatable in the first direction;

a main driving mechanism configured to stretch/retract the articulated arm unit;

a sub-driving mechanism configured to reciprocate the support member relative to the distal end arm and including,
a piston cylinder disposed on the distal end arm, and
a piston rod reciprocated by the piston cylinder, the piston rod being connected to the support member; and a controller configured to drive the sub-driving mechanism independently of the main driving mechanism.

5. A transfer apparatus for a semiconductor process, comprising:

an articulated arm unit attached to a support base to be stretchable/retractable within a horizontal plane, the articulated arm unit having a distal end arm which reciprocates in a first direction when the articulated arm unit stretches and retracts;

a support member arranged on the distal end arm to support a target substrate, the support member being attached to the distal end arm to be reciprocatable in the first direction;

a main driving mechanism configured to stretch/retract the articulated arm unit;

a sub-driving mechanism configured to reciprocate the support member relative to the distal end arm and including,
a ball screw disposed on the distal end arm to apply a rotational driving force to the ball screw, and
a ball nut engaging with the ball screw and connected to the support member; and a controller configured to drive the sub-driving mechanism independently of the main driving mechanism.

6. A semiconductor processing system comprising:

an airtight process chamber;

a worktable with a mount surface to support a target substrate disposed in the process chamber;

a supply system configured to supply a process gas into the process chamber;

an exhaust system configured to evacuate an interior of the process chamber by vacuum;

an airtight transfer chamber connected to the process chamber through a gate;

a transfer apparatus disposed in the transfer chamber to load/unload the target substrate into/from the process chamber, the transfer apparatus comprising, an articulated arm unit attached to a support base to be stretchable/retractable within a horizontal plane, the articulated arm unit having a distal end arm which reciprocates in a first direction when the articulated arm unit stretches and retracts, a support member arranged on the distal end arm to support the target substrate, the support member being attached to the distal end arm to be linearly reciprocatable relative to the distal end arm in the first direction, a main driving mechanism configured to stretch/retract the articulated arm unit, and a sub-driving mechanism configured to reciprocate the support member relative to the distal end arm;

a set of first lifters and a set of second lifters disposed to surround the worktable and configured to assist loading/unloading of the target substrate on/from the mount surface, the set of first lifters and the set of second lifters providing support levels at different heights for the target substrate; and a lifter driving mechanism configured to vertically drive the first and second lifters relative to the worktable.

7. The semiconductor processing system of claim 6, wherein the transfer apparatus further comprises a pair of temporary shelves configured to support the target substrate, and disposed to sandwich the support member when the articulated arm unit and the support member retract, and a vertical driving mechanism configured to vertically drive the support member and the temporary shelves relative to each other in order to transfer the target substrate therebetween.

8. The semiconductor processing system of claim 6, further comprising:

a controller configured to drive the sub-driving mechanism independently of the main driving mechanism.

9. A semiconductor processing system comprising:

an airtight process chamber;

a worktable with a mount surface to support a target substrate disposed in the process chamber;

a supply system configured to supply a process gas into the process chamber;

an exhaust system configured to evacuate an interior of the process chamber by vacuum;

an airtight transfer chamber connected to the process chamber through a gate;

a transfer apparatus disposed in the transfer chamber to load/unload the target substrate into/from the process chamber, the transfer apparatus comprising, an articulated arm unit attached to a support base to be stretchable/retractable within a horizontal plane, the articulated arm unit having a distal end arm which reciprocates in a first direction when the articulated arm unit stretches and retracts, a support member arranged on the distal end arm to support the target substrate, the support member being attached to the distal end arm to be linearly reciprocatable relative to the distal end arm in the first direction, a main driving mechanism configured to stretch/retract the articulated arm unit, and a sub-driving mechanism configured to reciprocate the support member relative to the distal end arm, wherein the support member reciprocates relative to the distal end arm, while the articulated arm unit stretches and retracts.

10. The semiconductor processing system of claim 9, wherein transfer apparatus further comprises a pair of temporary shelves configured to support the target substrate, and disposed to sandwich the support member when the articulated arm unit and the support member retract, and a vertical driving mechanism configured to vertically drive the support member and the temporary shelves relative to each other in order to transfer the target substrate therebetween.

11. The semiconductor processing system of claim 9, further comprising:

a set of first lifters and a set of second lifters disposed to surround the worktable and configured to assist loading/unloading of the target substrate on/from the mount surface, the set of first lifters and the set of second lifters providing support levels at different heights for the target substrate; and a lifter driving mechanism configured to vertically drive the first and second lifters relative to the worktable.

* * * * *